United States Patent [19]
Michail et al.

[11] Patent Number: 5,760,649
[45] Date of Patent: Jun. 2, 1998

[54] BUFFER AMPLIFIER WITH OUTPUT NON-LINEARITY COMPENSATION AND ADJUSTABLE GAIN

[75] Inventors: Michel Salib Michail, South Burlington; Wilbur David Pricer, Charlotte, both of Vt.

[73] Assignee: International Business Machines Corporation, Armonk, N.Y.

[21] Appl. No.: 753,139

[22] Filed: Nov. 20, 1996

[51] Int. Cl.$^6$ ........................................... H03F 3/30
[52] U.S. Cl. ........................................... 330/264; 330/265
[58] Field of Search ........................ 330/264, 265, 330/277, 293

[56] References Cited

U.S. PATENT DOCUMENTS

| | | | |
|---|---|---|---|
| 3,914,702 | 10/1975 | Gehweiler | 330/264 |
| 4,021,747 | 5/1977 | Todokoro | 330/13 |
| 5,113,150 | 5/1992 | Waizman | 330/264 |
| 5,341,046 | 8/1994 | Crafts | 307/475 |
| 5,343,166 | 8/1994 | Pass | 330/264 |

*Primary Examiner*—James B. Mullins
*Attorney, Agent, or Firm*—Schmeiser, Olsen & Watts; Eugene I. Shkurko

[57] ABSTRACT

According to the preferred embodiment, a buffer amplifier is provided that provides improved linearity while providing increased control over the gain without unduly limiting the amplifier frequency response. The amplifier preferably includes a series pair of transistors with their gates connected to the amplifier input and their drains connected to the amplifier output. The amplifier further includes a pair of feedback transistors connected in series with the series pair. The gates of the feedback transistors are connected to the amplifier output through a pair of feedback networks. Each network includes at least one impedance element. The impedance elements are preferably selected to maximize the linearity of the amplifier response. Furthermore, the impedance elements can be selected to modify the gain of the amplifier, increasing the amplifier gain if needed.

21 Claims, 5 Drawing Sheets

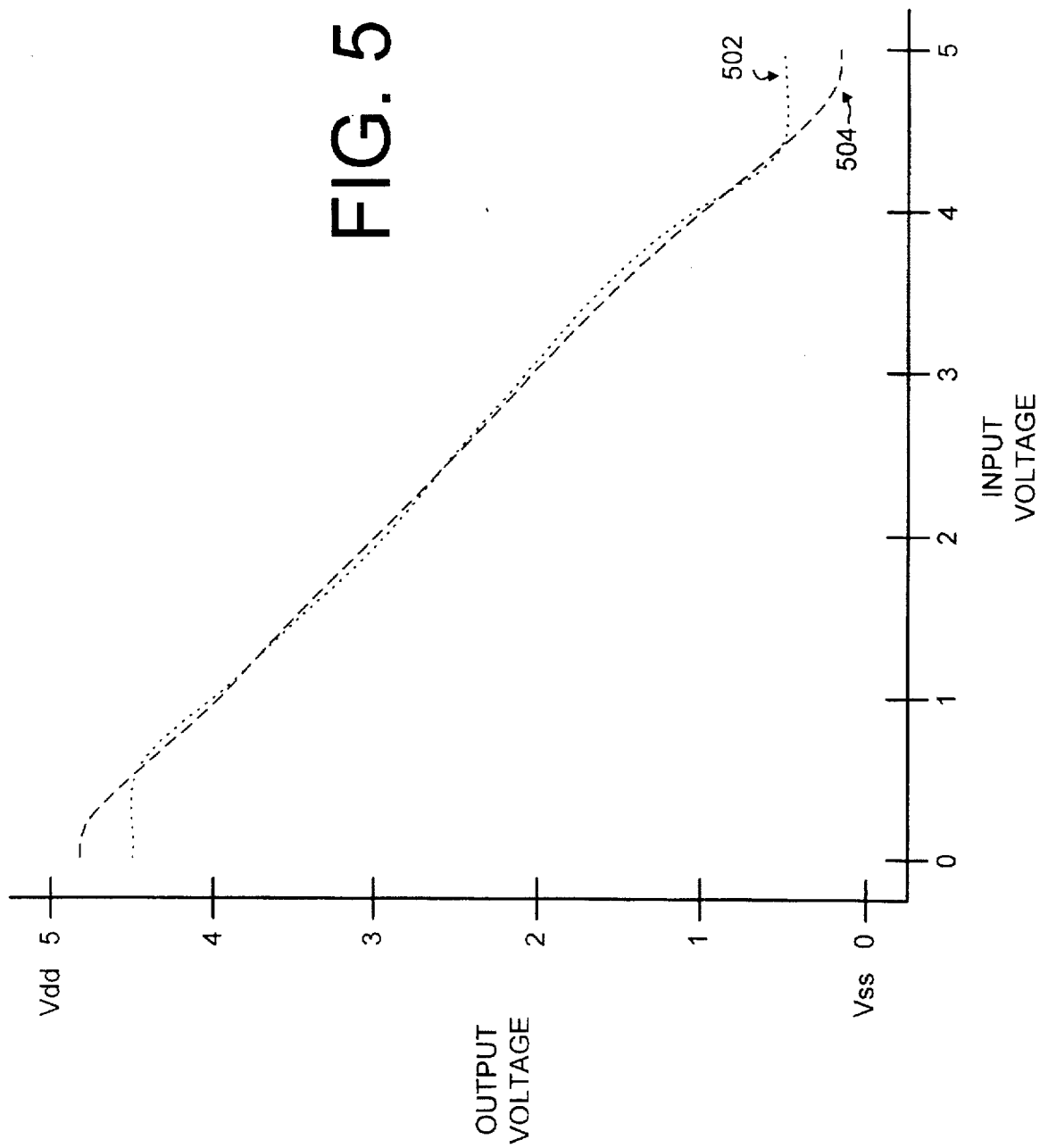

BUFFER AMPLIFIER WITH OUTPUT NON-LINEARITY COMPENSATION AND ADJUSTABLE GAIN

BACKGROUND OF THE INVENTION

1. Technical Field

This invention generally relates to amplifiers and more specifically relates to buffer amplifiers.

2. Background Art

A wide variety of amplifiers have been designed for use in many different applications. These different amplifiers have different characteristics such as gain, linearity, frequency response, input impedance and output impedance that determine for what applications they are suitable.

One class of amplifiers are called buffer amplifiers. These amplifiers are used to buffer circuit nodes that would otherwise have too high an impedance to sufficiently drive an output. Buffer amplifiers are generally designed to have a gain near positive or negative unity, a high input impedance and a relatively low output impedance.

One type of amplifier used as a buffer amplifier is a source follower. Source followers are well known amplifiers that use a field effect transistor (FET) to achieve a high input impedance and a low output impedance. Unfortunately, they have several limitations. First, source followers generally have a gain slightly less than one. This limitation is generally acceptable, but can be a problem in some applications where additional gain is required. Additionally, source follower amplifiers generally have a voltage offset (i.e., there is a small voltage difference between the output voltage and the input voltage) equal to the threshold voltage of the FET. Thus, their output voltage is never quite equal to the input voltage. Again, this limitation is sometimes acceptable, but can be a problem for some applications.

Another type of amplifier used as a buffer amplifier is a conventional operational amplifier (op-amp). Most single stage op-amps provide sufficient gain but have a problem with voltage translation between the input and output. This voltage translation causes the output to be offset slightly from the input. This usually requires the addition of a second stage which in turn adds a second pole to the frequency response of the overall amplifier. To minimize the effects of the second pole to the overall frequency response, one pole can be made dominant by adding a large capacitor. Unfortunately, adding such a capacitor limits the frequency response of the op-amp. Again, this limitation is acceptable for some applications, but may cause the op-amp to be unsuitable for applications that require a wide frequency response.

Simple inverters typically have a gain of about minus one but only for large signals. Unfortunately, the gain of simple inverters is excessively non-linear, and as such they are generally not suitable for amplifier applications. One approach to improve the linearity of the an inverter to facilitate its use was disclosed in "Unity Gain Inverting Amplifier Providing Linear Transfer Characteristics," U.S. Pat. No. 5,113,150 issued to Waizman and assigned to Intel Corporation. Turning to FIG. 4, FIG. 4 illustrates an amplifier 400 as disclosed in the Waizman patent. The amplifier 400 uses a standard CMOS inverter pair (transistors 22 and 23) with two additional transistors 21 and 24 connected in series with inverter transistors 22 and 23. The gates of transistors 21 and 24 are connected to the inverter output. The transistors 21 and 24 modify the transfer characteristics of the inverter, improving the linearity of the inverter and hence making the invertor suitable for use as a buffer amplifier. Unfortunately, the linearity of the amplifier 400, while improved over the traditional inverter, does not extend to operating regions near the two power supplies Vdd and Vss. Turning to FIG. 5, the transfer characteristics of the amplifier 400 are reproduced. In particular, the output voltage is mapped as a function of the input voltage and is shown as line 502. While the linearity of amplifier 400 is much improved over a standard inverter, the linearity of amplifier 400 deteriorates as the output voltage nears Vdd or Vss. Thus, amplifier 400 does not have the ability to drive its output from Vdd to Vss and still maintain satisfactory linearity. It should be noted that line 502 is an approximation and should not be considered an exact graph of the amplifier 400 transfer characteristics.

Thus, prior art buffer amplifiers have had the disadvantages of unacceptable linearity, limited operating region, voltage offset or limited frequency response. Therefore, what is needed is an amplifier with a minimal voltage offset, a wide frequency response range with an improved and wide-region linearity. Additionally, it is desirable that the gain of the buffer amplifier be as near to unity as possible.

DISCLOSURE OF INVENTION

According to the present invention, a buffer amplifier is provided that provides improved linearity while providing increased control over the gain without unduly limiting the amplifier frequency response. The amplifier preferably includes a series pair of transistors with their gates connected to the amplifier input and their drains connected to the amplifier output. The amplifier further includes a pair of feedback transistors connected in series with the series pair. The gates of the feedback transistors are connected to the amplifier output through a pair of feedback networks. Each network includes at least one impedance element. The impedence elments are preferably selected to maximize the lineairty of the amplifier response. Furthermore, the impedence elements can be selected to modify the gain of the amplifier, increasing the amplifier gain if needed.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and:

FIG. 5 is a graph of the transfer characteristics of amplifier 100 and amplifier 400.

BEST MODE FOR CARRYING OUT THE INVENTION

The preferred embodiment of the present invention provides an improved amplifier that is particularly suited for use as a buffer amplifier. In particular, the amplifier of the preferred embodiment of the present invention provides a high impedance input, a low impedance output, a wide frequency response, with a very linear gain for a wide range of voltage approaching the voltage limits of the two power supplies. Additionally, the preferred embodiment amplifier can be tailored to have a gain of slightly greater than one. This makes the preferred embodiment particularly suited for use as the output stage on multistage amplifiers.

Figure 1:
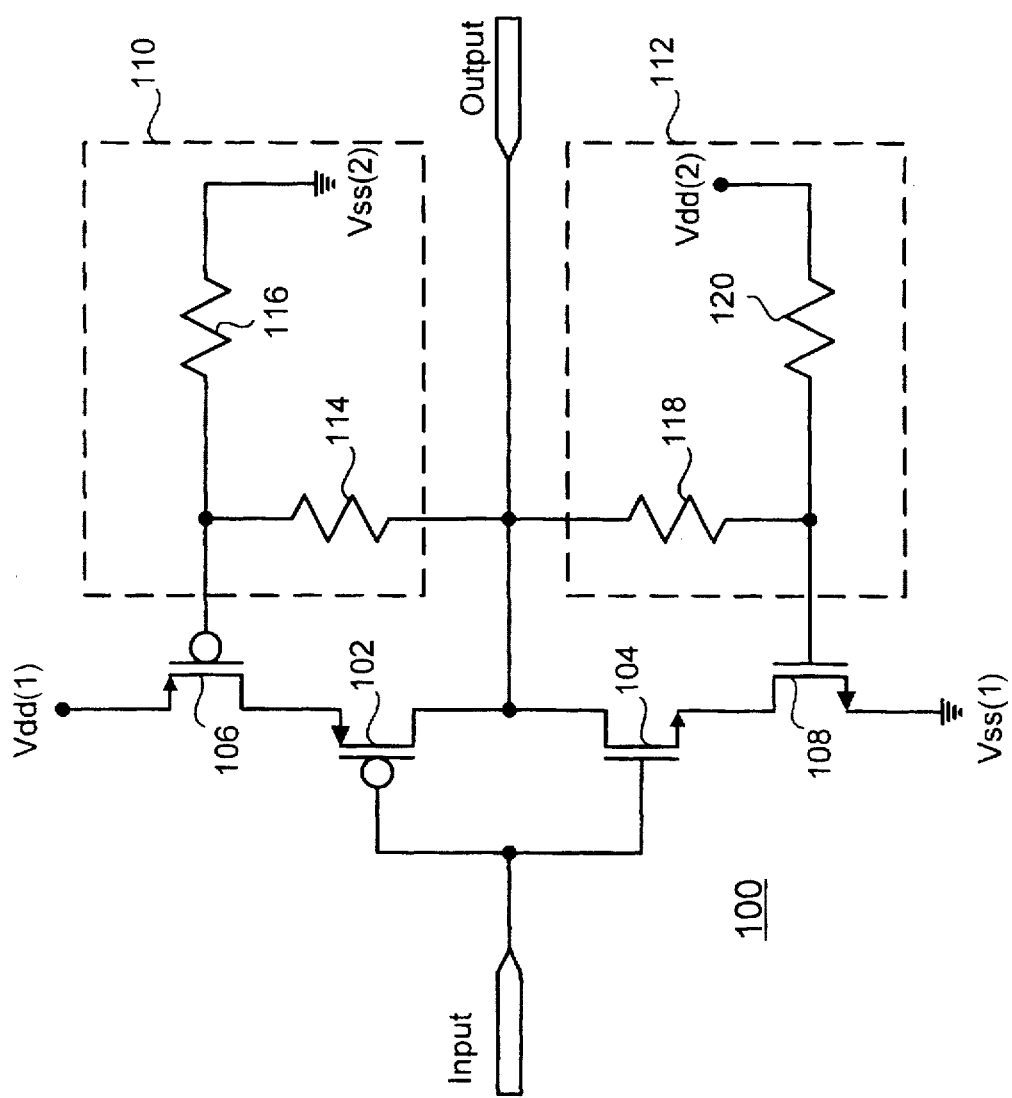
FIG. 1 is a schematic view of a amplifier 100 in accordance with a preferred embodiment of the present invention.

Turning now to FIG. 1. FIG. 1 is a schematic view of a amplifier 100 in accordance with a first embodiment. The amplifier 100 receives an input and outputs an output. The amplifier 100 comprises a series pair of transistors, including a first transistor 102 and a second transistor 104. Additionally, the amplifier 100 comprises a pair of feedback transistors, including a first feedback transistor 106 and second feedback transistor 108. The first and second feedback transistors 106 and 108 are coupled to the amplifier 100 output through a first feedback network 110 and a second feedback network 112 respectively.

The transistors are arranged in a series between a high supply potential Vdd(1) and a low supply potential Vss(1). In the preferred and illustrated embodiment, the low supply potential Vss(1) is equal to ground, but other potentials are equally within the scope of the illustrated embodiment.

The first transistor 102 and first feedback transistor 106 are preferably P-channel devices, while the second transistor 104 and second feedback transistor 108 are preferably N-channel devices.

The gates of the series pair transistors (i.e., first transistor 102 and second transistor 104) are tied to the amplifier input and the drains of the series pair are connected to the amplifier output. Thus, the series pair transistors work as a simple inverter and has a negative gain.

First feedback transistor 106 and second feedback transistor 108 are added in series with the series pair. The gates of first feedback transistor 106 and second feedback transistor 108 are connected to the amplifier 100 output through the first feedback network 110 and second feedback 112 respectively. This arrangement compensates and adds feedback to the response of the series pair, improving the linearity and modifying the gain of amplifier 100.

In particular, by choosing appropriate elements for first feedback network 110 and second feedback network 112 the linearity of the output can be greatly increased and extended to almost the full range between the two power supplies. Additionally, choosing the appropriate elements allows the amount of gain to be precisely adjusted.

The feedback operation of amplifier 100 is as follows. Assume the amplifier 100 input is going strongly positive. The amplifier 100 output will then start to go negative. This reduces the drive to the second feedback transistor 108. This lessens the amount of current that is available to flow through second transistor 104, thus providing a negative feedback.

Likewise, when the amplifier 100 input goes strongly negative the amplifier 100 output will then start to go positive. This reduces the drive to the first feedback transistor 106. This lessens the amount of current that is available to flow through first transistor 102, thus providing a negative feedback.

The overall affect of the negative feedback is to adjust the current supply for the series pair to compensate for the non-linearity of the inverter. The amount of adjustment and hence the overall linearity and gain is controlled by the relative size of the feedback transistors and elements in the feedback networks.

It is generally preferable to characterize the transistors and select the elements in the feedback network to match the characteristics of the transistors. For example, if the FETs used have more transconductance, the impedance of the resistors can be adjusted to compensate. In the embodiment illustrated in FIG. 1, the first feedback network 110 and the second feedback network 112 each include two impedances. The first feedback network 110 includes an impedance 114 between the gate of the first feedback transistor 106 and the amplifier output. The first feedback network 110 also includes a second impedance 116 between the gate of the first feedback transistor 108 and the a low supply potential Vss(2). Vss(2) is suitably any potential less than Vdd(1), and preferably equal to Vss(1).

The second feedback network 112 includes an impedance 118 between the gate of the second feedback transistor 108 and the amplifier output. The second feedback network 112 also includes a second impedance 120 between the gate of the second feedback transistor 108 and the a high supply potential Vdd(2). Vdd(2) is suitably any potential greater than Vss, and is preferably equal to high supply potential Vdd(1).

The preferred values for impedances 114, 116, 118 and 120 depend upon the characteristics of transistors 102, 104, 106, and 108 and the gain and linearity desired. As an example, a preferred set of transistor widths (in microns) and impedance combinations (in ohms) are illustrated in Tables 1 and 2 along with a suitable range of values. Of course, these values are given for illustration only and other combinations may be suitable depending upon the desired application.

TABLE 1

|  | T 102 | T 104 | T 106 | T 108 |
|---|---|---|---|---|
| Preferred | 64 μm | 44 μm | 16.5 μm | 6.0 μm |
| Suitable | 30–300 μm | 20–200 μm | 8–80 μm | 3–30 μm |

TABLE 2

|  | I 114 | I 116 | I 118 | I 120 |
|---|---|---|---|---|
| Preferred | 10 kΩ | 90 kΩ | 10 kΩ | 55 kΩ |
| Suitable | 5–20 kΩ | 40–200 kΩ | 5–20 kΩ | 25–100 kΩ |

The preferred values illustrated in Tables 1 and 2 assume a transistor channel length of 0.8 μm for all transistors, but other suitable dimensions can be used. Additionally, these values assume a gain of minus one. If a different gain is desired, the impedances and transistor sizes should be adjusted accordingly.

With the impedances properly selected to match the characteristics of the transistors, the linearity of the amplifier is greatly improved such that the amplifier 100 is particularly suited for use as a buffer amplifier in a wide variety of applications. Turning again to FIG. 5, the transfer characteristics of the amplifier 100 are illustrated as line 504 for an amplifier 100 having the preferred impedance and transistor values and where Vss(1)=Vss=0V and Vdd(1)=Vdd=5V. The amplifier 100 has a very linear amplification that extends from nearly Vdd to nearly Vss. Thus, the amplifier 100 is able to drive an output signal from nearly Vdd to Vss while maintaining satisfactory linearity.

Figure 2:
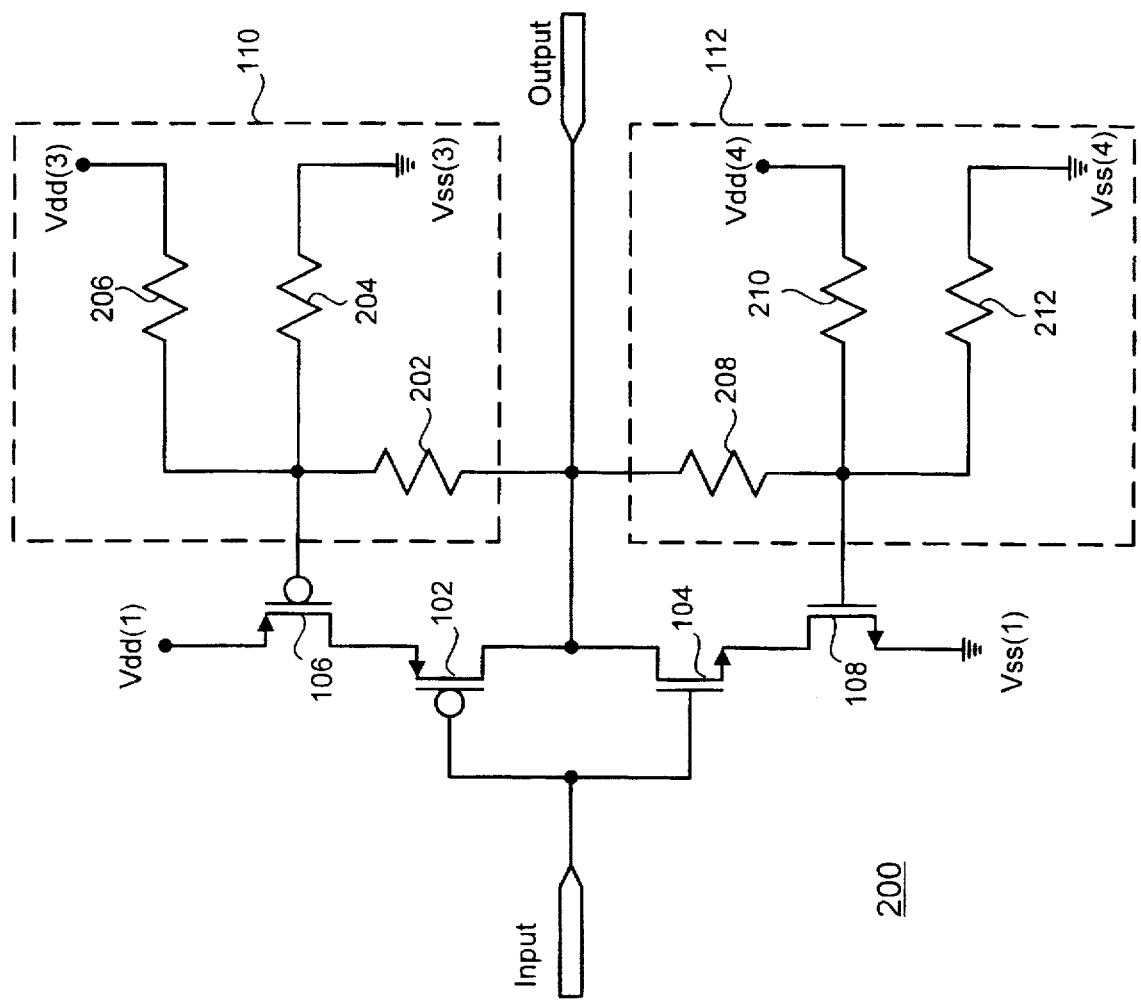
FIG. 2 is a schematic view an amplifier 200 in accordance with a second embodiment of the present invention.

Turning now to FIG. 2, an amplifier 200 is illustrated in accordance with a second embodiment. The amplifier 200 is similar to amplifier 100, with the most notable difference being in the first feedback network 110 and second feedback network 112.

In the embodiment illustrated in FIG. 2, the first feedback network 110 and the second feedback network 112 each include three impedances. The first feedback network 110 includes an impedance 202 between the gate of the first feedback transistor 106 and the amplifier output. The first feedback network 110 also includes a second impedance 204 between the gate of the first feedback transistor 108 and a low supply potential Vss(3). The first feedback network 110 also includes a third impedance 206 between the gate of the first feedback transistor 108 and a high supply potential Vdd(3).

The second feedback network 112 includes an impedance 208 between the gate of the second feedback transistor 108 and the amplifier output. The second feedback network 112 also includes a second impedance 210 between the gate of the second feedback transistor 108 and a high supply potential Vdd(4). The second feedback network 112 also includes a third impedance 212 between the gate of the second feedback transistor 108 and a low supply potential Vss(4).

Again, the preferred values for impedances 202, 204, 206, 208, 210 and 212 depend upon the characteristics of transistors 102, 104, 106, and 108 and the gain and linearity desired. The additionally impedances added (206 and 212) compared to the embodiment illustrated in FIG. 1 allow for further manipulation of the linearity and gain of the amplifier 200. As an example, a preferred set of transistor widths (in microns) and impedance combinations (in ohms) are illustrated in Tables 3 and 4 along with a suitable range of values. Of course, these values are given for illustration only and other combinations may be suitable depending upon the desired application.

TABLE 3

|  | T 102 | T 104 | T 106 | T 108 |
|---|---|---|---|---|
| Preferred | 64 μm | 44 μm | 16.5 μm | 6.0 μm |
| Suitable | 30–300 μm | 20–200 μm | 8–80 μm | 3–30 μm |

TABLE 4

|  | I 202 | I 204 | I 206 | I 208 | I 210 | I 212 |
|---|---|---|---|---|---|---|
| Pref. | 10 kΩ | 90 kΩ | 200 kΩ | 10 kΩ | 55 kΩ | 120 kΩ |
| Suit. | 5–20 kΩ | 40–200 kΩ | 100–400 kΩ | 5–20 kΩ | 25–100 kΩ | 60–240 kΩ |

Figure 3:
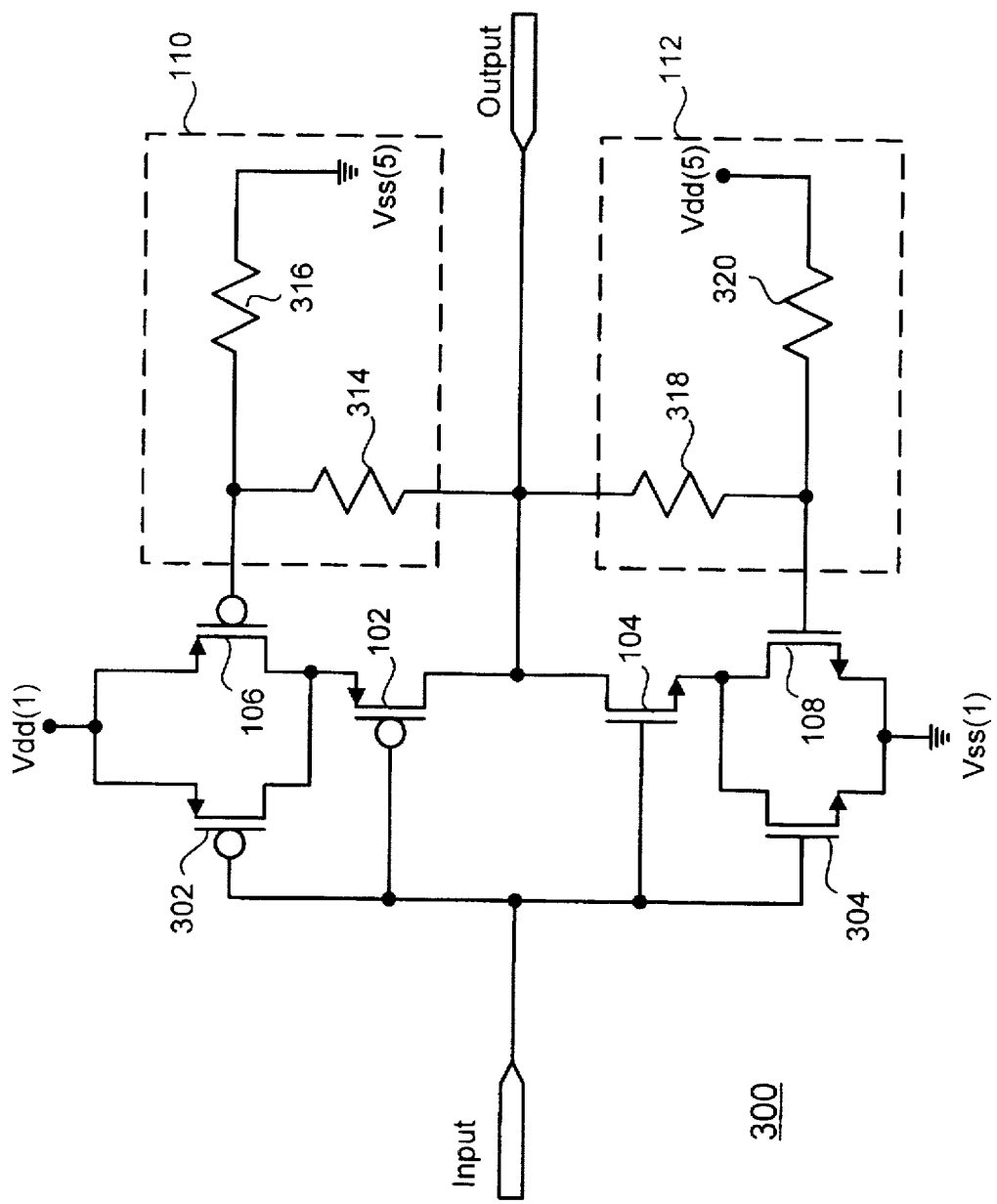
FIG. 3 is a schematic view an amplifier 300 in accordance with a third embodiment of the present invention.
Figure 4:
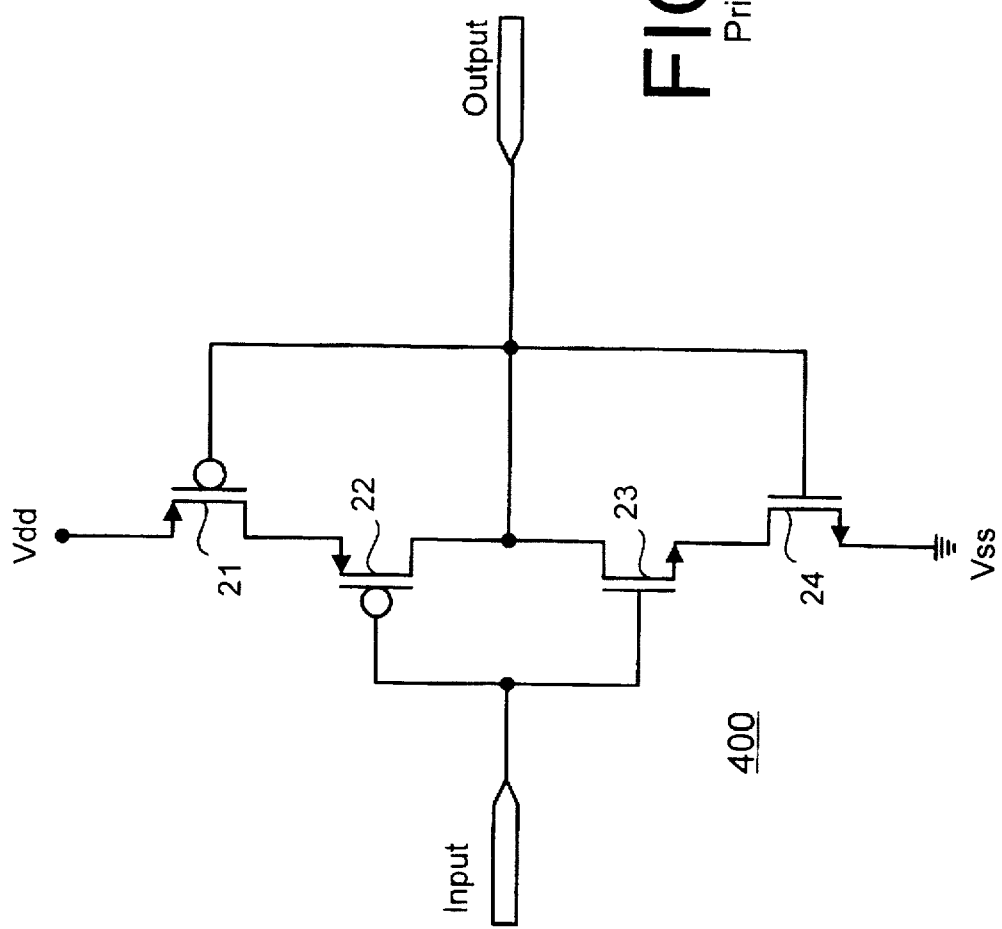
FIG. 4 is a schematic view of a prior art amplifier 400.

Turning now to FIG. 3, an amplifier 300 in accordance with a third embodiment. The amplifier 300 is similar to amplifier 100 of FIG. 1, with the most notable difference being in the addition of two compensating transistors 302 and 304 connected in parallel with first feedback resistor 106 and second feedback resistor 108 respectively.

The first compensating transistor 302 is preferably a P-channel device and the second compensating transistor 304 is preferably a N-channel device. These transistors are preferably selected to be relatively weak when compared to the other transistors in amplifier 300. The first compensating transistor 302 is thus preferably significantly smaller than the transistor 102. Likewise, the second compensating transistor 304 is preferably significantly smaller than transistor 104.

These compensation transistors 302 and 304 bypass the feedback transistors 106 and 108 respectively. Thus, compensation transistors allow the amount of negative feedback control to be lessened. This allows the linearity and gain of amplifier 300 to be further manipulated. As an example, a preferred set of transistor widths (in microns) and impedance combinations (in ohms) are illustrated in Tables 5 and 6 along with a suitable range of values. Of course, these values are given for illustration only and other combinations may be suitable depending upon the desired application.

TABLE 5

|  | T 102 | T 104 | T 106 | T 108 | T 302 | T 304 |
|---|---|---|---|---|---|---|
| Pref. | 64 μm | 44 μm | 16.5 μm | 6.0 μm | 10.0 μm | 4.0 μm |
| Suit. | 30–300 μm | 20–200 μm | 8–80 μm | 3–30 μm | 5 . 50 μm | 2–20 μm |

TABLE 6

|  | I 314 | I 316 | I 318 | I 320 |
|---|---|---|---|---|
| Preferred | 10 kΩ | 90 kΩ | 10 kΩ | 55 kΩ |
| Suitable | 5–20 kΩ | 40–200 kΩ | 5–20 kΩ | 25–100 kΩ |

Thus, the preferred embodiments provide an amplifier with improved linearity while maintaining a wide frequency response and low voltage offset. One application for which the preferred embodiment amplifiers are particularly suited is to for use as the final stage of a high gain cascade operational amplifier (op-amp). In particular, by properly selecting the impendence and transistors the buffer amplifier can be designed to have a gain slightly greater than unity. This will allow the op-amp to drive its output to nearly rail to rail Vdd(1) to Vss(1) in the illustrated embodiments. This is accomplished without unduly limiting the frequency response of the op-amp, as prior art solutions sometimes have.

While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductor, as is understood in the art.

We claim:

1. An amplifier, said amplifier having an input and an output, said amplifier comprising:

a) a series pair of transistors including a first transistor and a second transistor, said first and second transistors each having a gate, a drain, and a source, the gates of said first and second transistors connected to said amplifier input and the drains of said first and second transistors connected to said amplifier output;

b) a first feedback transistor including a source, a drain, and a gate, said first feedback transistor connected in series with said first transistor, and the gate of said first feedback transistor connected to said amplifier output through a first feedback network;

c) a second feedback transistor including a source, a drain, and a gate, said second feedback transistor connected in series with said second transistor, and the gate of said second feedback transistor connected to said amplifier output through a second feedback network d) wherein said first and second feedback networks each include at least one positive impedance, said impedance selected to improve the linearity of said output of said amplifier.

2. The amplifier of claim 1 wherein said first transistor and said first feedback transistor comprise P-channel devices and wherein said second transistor and said second feedback transistor comprise N-channel devices.

3. The amplifier of claim 1 wherein said first feedback network includes a first impedance connected between said first feedback transistor gate and said amplifier output and a second impedance connected between said first feedback transistor gate and a supply potential.

4. The amplifier of claim 1 wherein said first feedback network includes:

a first impedance connected between said first feedback transistor gate and said amplifier output and a second impedance connected between said first feedback transistor gate and a low supply potential; and wherein said second feedback network includes a third impedance connected between said second feedback transistor gate and said amplifier output and a fourth impedance connected between said second feedback transistor gate and a high supply potential.

5. The amplifier of claim 4 wherein said first impedance is in a range from 5 to 20 kΩ and wherein said second impedance is in a range from 40 to 200 kΩ and wherein said third impedance is in a range from 5 to 20 kΩ and wherein said fourth impedance is in a range from 25 to 100 kΩ.

6. The amplifier of claim 4 wherein said first impedance comprises approximately 10 kΩ and wherein said second impedance comprises approximately 90 kΩ and wherein said third impedance comprises approximately 10 kΩ and wherein said fourth impedance comprises approximately 55 kΩ.

7. The amplifier of claim 1 wherein said first transistor has a channel width in a range from 30 to 300 μm and wherein said first feedback transistor has a channel width in a range from 8 to 80 μm and wherein said second transistor has a channel width in a range from 20 to 200 μm and wherein said second feedback transistor has a channel width from 3 to 30 μm.

8. The amplifier of claim 1 wherein said first transistor includes a channel width of approximately 64 μm and wherein said first feedback transistor includes a channel width of approximately 16.5 μm and wherein said second transistor includes a channel width of approximately 44 μm and wherein said second feedback transistor includes a channel width of approximately 6.0 μm.

9. The amplifier of claim 1 wherein said first feedback network includes a first impedance connected between said first feedback transistor gate and said amplifier output and a second impedance connected between said first feedback transistor gate and a first supply potential and a third impedance connected between said first feedback transistor gate and a second supply potential.

10. The amplifier of claim 1 wherein said first feedback network includes:

a first impedance connected between said first feedback transistor gate and said amplifier output and a second impedance connected between said first feedback transistor gate and a first low supply potential and a third impedance connected between said first feedback transistor gate and a first high supply potential; and wherein said second feedback network includes a fourth impedance connected between said second feedback transistor gate and said amplifier output and a fifth impedance connected between said second feedback transistor gate and second high supply potential and a sixth impedance connected between said second feedback transistor gate and a second low supply potential.

11. The amplifier of claim 10 wherein said first impedance is in a range from 5 to 20kΩ and wherein said second impedance is in a range from 40 to 200 kΩ and wherein said third impedance is in a range from 100 to 400kΩ and wherein said fourth impedance is in a range from 5 to 20 kΩ and wherein said fifth impedance is in a range from 25 to 100 kΩ and wherein said sixth impedance is in a range from 60 to 240 kΩ.

12. The amplifier of claim 10 wherein said first impedance comprises approximately 10 kΩ and wherein said second impedance comprises approximately 90 kΩ and wherein said third impedance comprises aproximately 200 kΩ and wherein said fourth impedance comprises approximately 10 kΩ and wherein said fifth impedance comprises approximately 55 kΩ and wherein said fourth impedance comprises approximately 120 kΩ.

13. The amplifier of claim 1 further comprising a first compensation transistor connected in parallel with said first feedback transistor and a second compensation transistor connected in parallel with said second feedback transistor.

14. The amplifier of claim 13 wherein said first compensation transistor includes a gate and wherein said first compensation transistor gate is connected to said amplifier input and wherein said second compensation transistor includes a gate and wherein said second compensation transistor gate is connected to said amplifier input.

15. The amplifier of claim 13 wherein said first feedback network includes a first impedance connected between said first feedback transistor gate and said amplifier output and a second impedance connected between said first feedback transistor gate and a supply potential.

16. The amplifier of claim 13 wherein said first feedback network includes:

a first impedance connected between said first feedback transistor gate and said amplifier output and a second impedance connected between said first feedback transistor gate and a low supply potential; and wherein said second feedback network includes a third impedance connected between said second feedback transistor gate and said amplifier output and a fourth impedance connected between said second feedback transistor gate and a high supply potential.

17. The amplifier of claim 16 wherein said first impedance is in a range from 5 to 20 kΩ and wherein said second impedance is in a range from 40 to 200 kΩ and wherein said third impedance is in a range from 5 to 20 kΩ and wherein said fourth impedance is in a range from 25 to 100 kΩ.

18. The amplifier of claim 16 wherein said first impedance comprises approximately 10 kΩ and wherein said second impedance comprises approximately 90 kΩ and wherein said third impedance comprises approximately 10 kΩ and wherein said fourth impedance comprises approximately 55 kΩ.

19. The amplifier of claim 16 wherein said first transistor has a channel width in a range from 30 to 300 μm and wherein said first feedback transistor has a channel width in a range from 8 to 80 μm and wherein said first compensation transistor has a channel width in a range from 5 to 50 μm and wherein said second transistor has a channel width in a range from 20 to 200 μm and wherein said second feedback transistor has a channel width in a range from 3 to 30 μm and wherein said second compensation transistor has a channel width in a range from 2 to 20 μm.

20. The amplifier of claim 16 wherein said first transistor includes a channel width of approximately 64 μm and wherein said first feedback transistor includes a channel width of approximately 16.5 μm and wherein said first compensation transistor includes a channel width of approximately 10 μm and wherein said second transistor includes a channel width of approximately 44 μm and wherein said second feedback transistor includes a channel width of approximately 6.0 μm and wherein said second compensation transistor includes a channel width of approximately 4.0 μm.

21. A method for improving the linearity of a buffer amplifier, the method comprising the steps of:

a) providing an amplifier, said amplifier including:
 i) a series pair of transistors including a first transistor and a second transistor, said first and second transistors each having a gate, a drain, a source, the gate of said first and second transistors connected to an amplifier input and the drain of said first and second transistor connected to an amplifier output;
 ii) a first feedback transistor including a source, a drain, and a gate, said first feedback transistor connected in series with said first transistor, and the gate of said first feedback transistor connected to said amplifier output through a first feedback network;
 iii) a second feedback transistor including a source, a drain, and a gate, said second feedback transistor connected in series with said second transistor, and the gate of said second feedback transistor connected to said amplifier output through a second feedback network
 iv) wherein said first and second feedback networks each include at least one impedance; and b) selecting said at least one impedance to improve the linearity of said amplifier.

* * * * *

UNITED STATES PATENT AND TRADEMARK OFFICE
CERTIFICATE OF CORRECTION

PATENT NO. : 5,760,649
DATED : June 2, 1998
INVENTOR(S) : Michail et al.

It is certified that error appears in the above-indentified patent and that said Letters Patent is hereby corrected as shown below:

In column 6 at line 23, in TABLE 5 at column T302 in row Suit., the value "5.50 µm" should read --5-50 µm--.

Signed and Sealed this

Eighteenth Day of August, 1998

Attest:

BRUCE LEHMAN

Attesting Officer      *Commissioner of Patents and Trademarks*